United States Patent
Hausperger et al.

(10) Patent No.: US 7,332,903 B2
(45) Date of Patent: Feb. 19, 2008

(54) DEVICE AND METHOD FOR MEASURING A CURRENT FLOWING IN AN ELECTRICAL CONDUCTOR

(75) Inventors: Christian Hausperger, Bonbruck (DE); Edgar Kindler, Landshut (DE)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 0 days.

(21) Appl. No.: 11/510,124

(22) Filed: Aug. 25, 2006

(65) Prior Publication Data

US 2007/0052407 A1    Mar. 8, 2007

(30) Foreign Application Priority Data

Aug. 25, 2005 (DE) .................. 10 2005 040 316

(51) Int. Cl.
*G01R 33/07* (2006.01)
*G01R 15/18* (2006.01)
*G01R 1/38* (2006.01)

(52) U.S. Cl. ............................ 324/117 H; 324/117 R; 324/115

(58) Field of Classification Search ................ 324/115, 324/117 R, 117 H, 126–127, 252; 323/368
See application file for complete search history.

(56) References Cited

U.S. PATENT DOCUMENTS

| | | | | |
|---|---|---|---|---|
| 2,464,807 | A * | 3/1949 | Hansen, Jr. .................. | 363/140 |
| 3,323,056 | A * | 5/1967 | Haley ...................... | 324/117 R |
| 3,482,163 | A | 12/1969 | Peek et al. | |
| 3,974,425 | A | 8/1976 | Ueda et al. | |
| 4,059,798 | A | 11/1977 | Dierker et al. | |
| 4,742,296 | A * | 5/1988 | Petr et al. .................... | 324/142 |
| 4,939,448 | A | 7/1990 | Gudel | |
| 4,947,108 | A | 8/1990 | Gudel | |
| 5,103,163 | A * | 4/1992 | McLyman ................ | 324/117 H |
| 5,475,301 | A | 12/1995 | Kawakami et al. | |
| 5,479,095 | A * | 12/1995 | Michalek et al. ........ | 324/117 H |
| 6,411,078 | B1 * | 6/2002 | Nakagawa et al. ..... | 324/117 H |

FOREIGN PATENT DOCUMENTS

| | | |
|---|---|---|
| DE | 1 209 198 B | 11/1963 |
| DE | 25 06 918 C3 | 9/1975 |
| DE | 27 06 547 C3 | 9/1977 |
| DE | 38 35 101 A1 | 5/1989 |

(Continued)

OTHER PUBLICATIONS

European Search Report 06010079.9 dated Sep. 1, 2006.

*Primary Examiner*—Ha Tran Nguyen
*Assistant Examiner*—Joshua Benitez
(74) *Attorney, Agent, or Firm*—Wolf, Greenfield & Sacks, P.C.

(57) ABSTRACT

A device is provided for measuring a current flowing in an electrical conductor with a magnetic circuit for coupling to the electrical conductor. The magnetic circuit has an air gap, and a magnetic field sensitive component is disposed in the air gap. The magnetic field sensitive component measures the magnetic field generated by the electrical conductor. Two control cores are disposed in the air gap to control an effective size of the air gap. The control cores each have a control winding for magnetic saturation of the respective control core to control the effective length of the air gap. The magnetic field sensitive component is disposed between the control cores.

25 Claims, 2 Drawing Sheets

FOREIGN PATENT DOCUMENTS

| | | |
|---|---|---|
| DE | 39 05 060 C2 | 8/1990 |
| DE | 42 29 065 A1 | 3/1994 |
| DE | 42 29 948 A1 | 3/1994 |
| DE | 199 10 411 C2 | 9/2000 |
| DE | 101 05 186 A1 | 8/2002 |
| EP | 0 499 589 B1 | 1/1996 |
| EP | 0 558 702 B1 | 5/1996 |
| EP | 0 584 295 B1 | 10/1997 |
| EP | 0 815 456 B1 | 1/1998 |
| EP | 1 250 605 B1 | 3/2004 |
| EP | 1 084 417 B1 | 4/2004 |
| GB | 1 478 225 | 6/1977 |
| GB | 2 228 337 A | 2/1989 |
| JP | 01281715 A | 11/1989 |
| JP | 03170873 A | 7/1991 |
| WO | WO 01/40811 A2 | 6/2001 |
| WO | WO 2004/006373 A2 | 7/2004 |
| WO | WO 2005/005998 A1 | 1/2005 |

* cited by examiner

DEVICE AND METHOD FOR MEASURING A CURRENT FLOWING IN AN ELECTRICAL CONDUCTOR

CROSS REFERENCE TO RELATED APPLICATION

Foreign priority benefits are claimed under 35 U.S.C. §119(a)-(d) or 35 U.S.C. §365(b) of German Application No. 10 2005 040 316.6, filed Aug. 25, 2005, which is hereby incorporated by reference in its entirety.

BACKGROUND OF THE INVENTION

1. Field

The present invention relates to a sensor for measuring a current flowing in an electrical conductor, and more particularly to a sensor with two or more modes for measuring current.

2. Discussion of Related Art

The rising number of electrical consumer loads in motor vehicles has created an ever-increasing demand for power in on-board electrical systems of vehicles. As a result, the load on the on-board battery, which serves as a backup during operation of the vehicle and maintains the vehicle's voltage supply when the engine is switched off, is becoming ever greater. These greater loads can lead to a failure to completely charge the battery during engine operation, particularly where the vehicle is subject to increased use for short-run operations. Such incompletely charged batteries can result in dead batteries, vehicle break downs, and/or an inability to start a vehicle due to a low battery voltage.

Energy management systems are increasingly being used in vehicles to prevent battery charging failures. Such energy management systems are intended to ensure that the charging condition of the battery does not reach a critical state and to ensure a positive charging balance of the battery. These systems perform analysis of the battery's condition, based on measured variables for battery current, battery voltage and battery temperature. In many systems, the detection of a charging or discharging current is significant in keeping the battery at a non-critical charge level to ensure the ability to start a vehicle.

The sensor shown in FIGS. 3 and 4 is known from the prior art for use in a motor vehicle for monitoring flowing currents. As shown, a measuring shunt 202 is inserted in earth conductor 201 to detect the battery current. An analyzing unit 203 directly measures the voltage drop at the measuring shunt and from this measurement calculates the level of current that is flowing. The measuring shunt may be made of Manganin.

FIG. 3 shows the measuring set-up associated with a sensor like that shown in FIG. 4. A car battery 205 is connected to the vehicle earth by way of an earth conductor 201. The sensor, comprising measuring shunt 202 and analyzing unit 203, is integrated into earth conductor 201. Electrical consumer loads 206 of the vehicle are connected to the positive pole of battery 205 by way of a conductor 207.

The sensor and configuration of FIGS. 3 and 4 do exhibit some disadvantages. The measuring shunt has to be integrated into the conductor that carries the current, which causes additional design expenditure since it is necessary to ensure that shear and tensile forces are not imparted to the measuring shunt. Deformation of the measuring shunt may influence the measured result and, in some cases, can lead to a fault in the sensor. Moreover, the configuration of FIGS. 3 and 4 necessarily incurs a heat loss via the measuring shunt. By way of example, even when using low resistances, such as those associated with a 100 mW measuring shunt, heat is still lost and has to be dissipated.

To overcome disadvantages in prior art designs, there is a need for a sensor that can detect the charging and/or discharging current over a very wide range, for example from −200 A to 1500 A. There is also a need for a suitable sensor, such as for use in energy management of a vehicle, that can cover this wide range of currents and have a high dynamic response.

SUMMARY

According to one aspect of the invention, a device for measuring a current flowing in an electrical conductor is disclosed. The device comprises a magnetic circuit having an air gap. A magnetic field sensitive component is disposed in the air gap of the magnetic circuit. The magnetic field sensitive component is suitable for measuring the magnetic field generated by current flowing in the electrical conductor. One or more control cores are incorporated into the magnetic circuit to control an effective length of the air gap. The control cores are disposed in said air gap of the magnetic circuit. The one or more control cores each have a control winding to saturate the respective control core to control the effective length of the air gap. The magnetic field sensitive component is disposed between the control cores.

According to another aspect of the invention, a device is disclosed for measuring a current over a first range and a second range. The device comprises a magnetic circuit positioned adjacent to a conductor and defining an air gap. The magnetic field sensitive component is positioned in the air gap to measure a magnetic field generated by current flowing in an electrical conductor. A control core is incorporated into the magnetic circuit adjacent to the magnetic field sensitive component. The device also includes a control winding, that when activated, saturates the control core. The device is configured to measure currents flowing in the electrical conductor in a first range of current values when the control winding is unactivated. The device is also configured to measure currents flowing in the electrical conductor in a second range of current values, at least some of which are greater than the first range of current values, when the control winding is activated.

According to another aspect of the present invention, a method is disclosed for measuring current flowing in an electrical conductor. The method comprises providing a device for measuring a current flow in an electrical conductor. The device comprises a magnetic circuit having an air gap. A magnetic field sensitive component is disposed in the air gap of the magnetic circuit. The magnetic field sensitive component is suitable for measuring the magnetic field generated by current flowing in the electrical conductor. One or more control cores are incorporated into the magnetic circuit to control an effective length of the air gap. The control cores are disposed in said air gap of the magnetic circuit. The one or more control cores each have a control winding to saturate the respective control core to control the effective length of the air gap. The magnetic field sensitive component is disposed between the control cores. The method comprises measuring the magnetic field in the magnetic circuit without excitation of the control cores. The method also comprises measuring the magnetic field in the magnetic circuit with saturated control cores.

According to another aspect of the present invention, a method is disclosed for measuring current over a first range and second range. The method comprises positioning a magnetic circuit adjacent to a conductor that carries a current to be measured and positioning a magnetic field sensitive component in an air gap of the magnetic circuit. The method also comprises measuring a magnetic field generated by current in the first range flowing in the electrical conductor. The method also comprises incorporating a control core having a control winding into the magnetic circuit adjacent to the magnetic field sensitive component and activating the winding to saturate the control core to allow the device to measure current in the second range flowing in the electrical conductor.

Various embodiments of the present invention provide certain advantages. Not all embodiments of the invention share the same advantages and those that do may not share them under all circumstances.

Further features and advantages of the present invention, as well as the structure of various embodiments of the present invention are described in detail below with reference to the accompanying drawings.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. Various embodiments of the invention will now be described, by way of example, with reference to the accompanying drawings, in which.

DETAILED DESCRIPTION OF THE DRAWINGS

Figure 1:
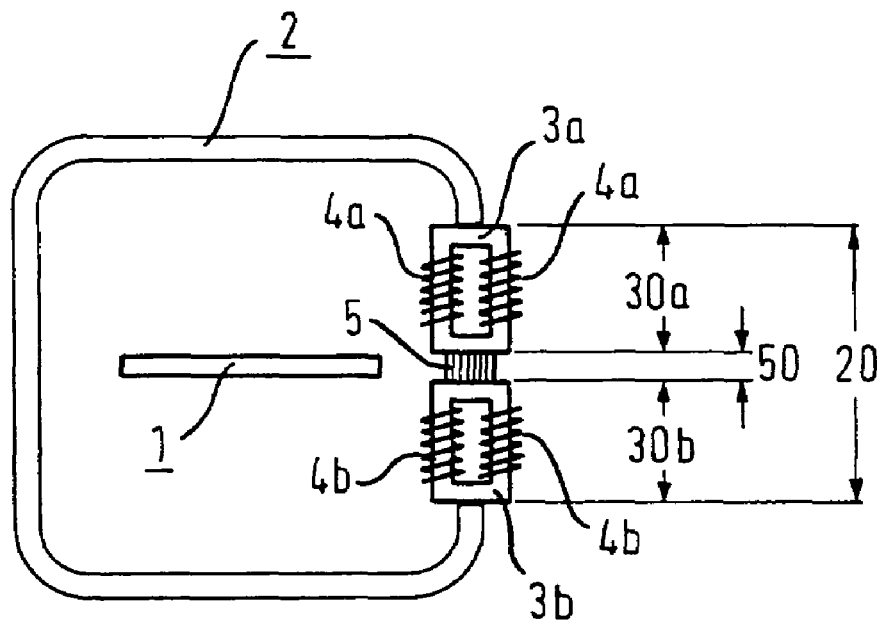
FIG. 1 a schematic diagram of a current sensor in a first embodiment.

The device of the present invention is configured to measure current flowing through a conductor over a wide range of values with a good dynamic response. By activating a control winding that is associated with a control core in a magnetic circuit of the device, the device can switch between a first mode, for measuring current in a first range, to a second mode, for measuring current in a second range, Activating the control winding saturates the control core, thus altering the magnetic properties of the magnetic circuit, allowing the device to effectively measure current in a different range.

According to aspects of the invention, a device is provided for measuring a current flowing in an electrical conductor. The device is capable of addressing the drawbacks of the prior art and enables reliable measurement of a current in an electrical conductor over a broad measuring range.

According to illustrative embodiments of the invention, the device has a magnetic circuit coupled to an electrical conductor. The magnetic circuit includes an air gap, and a magnetic field sensitive component is disposed in the air gap of the magnetic circuit for measuring the magnetic field generated by the electrical conductor. In some embodiments, two control cores are disposed in the air gap of the magnetic circuit and may be used to control the effective size of the air gap, which may be accomplished with control cores that each have a control winding that can be used to cause magnetic saturation of a respective control core. Saturating the magnetic core can control the effective length of the air gap, in which the magnetic field sensitive component may be disposed.

In some embodiments, the magnetic field sensitive component may be disposed substantially in the center of the air gap of the magnetic circuit, due to the magnetic field sensitive component being disposed between the control cores, although aspects of the invention are not limited in this respect. In a mode where the two control cores are unsaturated, the effective length of the air gap may correspond substantially to the dimension of the magnetic field sensitive component. However, the control cores may become ineffective for the magnetic circuit in a mode where both control cores are saturated, such as due to the application of a current to the control winding. In such a mode, the air gap is enlarged by the length of the now saturated and thus ineffective control cores. Here still, the magnetic field sensitive component may be located in the center of the overall air gap that is generated, although it is not required to be. It is to be appreciated that the term "air gap" as used herein, refers to the effective air gap of the magnetic circuit, and that the air gap may span a distance that includes physical elements, such as the magnetic filed sensitive component and/or saturated control cores.

According to some embodiments, the device is constructed to have multiple modes that are each sensitive to measure a particular range of currents, which may or may not overlap with one another. The device can switch between modes by a current being passed through the control windings of the control cores. Passing current through the control windings of the control cores can cause magnetic saturation of the control cores. Magnetic saturation of the control cores can, in turn, cause the control cores become ineffective for the magnetic circuit. As a result, the effective air gap of the magnetic circuit may be enlarged such that the field bound in the magnetic circuit is weakened. In such a mode with a large effective air gap, it is possible, using the magnetic field sensitive element, to measure larger currents. This is due to the larger magnetic fields that will be induced in the magnetic circuit, as the field bound in the magnetic circuit is weakened by the enlarged air gap at high currents.

To measure smaller currents, the control windings of the control cores may be switched off. In such a mode, the control cores fill a further area of the air gap with magnetisable material, thus reducing the effective air gap. With the control windings switched off in the embodiment illustrated in FIG. 1, the effective air gap consists only of the magnetic field sensitive component. However, in other embodiments the air gap may be larger than the magnetic field sensitive components such as when there is a physical space between the magnetic field sensitive component and the control cores.

The dynamic response of the magnetic field sensitive component may be utilized well, particularly in embodiments with multiple modes each configured to measure a different range of currents. The multiple modes may help prevent the dynamic response of the magnetic field sensitive component from being exceeded, and thus may prevent erroneous measurements from occurring. In this regard, embodiments of the device may make it possible to ensure an effective measuring range switching, by changing the effective length of the air gap to adapt the magnetic field as needed.

In some illustrative embodiments, the device has two separate control cores and a magnetic field sensitive component disposed between the control cores. As illustrated, the magnetic field sensitive component, such as a Hall sensor, is disposed in the central area of the air gap, although the present invention is not limited in this regard. In such an embodiment, the Hall sensor may be located in the center of the effective air gap, even when the two cores are saturated by passing a current through the control windings. In this mode, with the control cores saturated, the bound magnetic field is lowest at the center of the air gap, which allows higher currents to be measured.

According to some illustrative embodiments, two separate control cores allow a three-stage switching between three different modes. Here, the modes include a state in which no single control core is saturated, a state in which a single control core is saturated and a state in which both control cores are saturated. It is to be appreciated that other conventions are also possible, as the present invention is not limited to having one, two, or three modes of operation, and in some embodiments may have greater numbers of modes of operation.

In some embodiments, when the device is operating in a sensitive mode with the control windings switched off, the magnetic field sensitive component measures the magnetic field carried in the overall magnetic circuit. In such a mode, the overall magnetic circuit includes all of the magnetic circuit and the control cores. In a second mode, with the control windings switched on, the magnetic field sensitive component is located in a position of the effective air gap where the magnetic field is weakest, that is, in the center of the air gap, although it is not required to be positioned in this manner. In this regard, through switching the control cores off and/or on, a greater measuring range switching may be attained. It is to be appreciated that the measuring range may be maximized by adjusting the construction of the cores and air gap to accommodate different individual ranges, as may be required for specific applications.

As discussed herein, the control cores of some embodiments may have a first saturation magnetization and the magnetic circuit may have a second saturation magnetization where the first saturation magnetization is greater, smaller or equal to the second saturation magnetization. Depending on the design of the saturation magnetizations, it can be possible to achieve a saturation of the control cores even when applying small control currents. Also, with high saturation magnetizations of the control cores, it may be possible to prevent leak currents from generating a measuring range switching.

In a variation of the above described embodiment, the two control cores may have different saturation magnetizations.

In some illustrative embodiments, the magnetic circuit substantially encloses the electrical conductor in order to achieve a reliable measurement of the current flowing in the electrical conductor.

In some illustrative embodiments, it may be advantageous for an effective measuring range switching if the control cores substantially fill the air gap, although this is not required. Moreover, in some embodiments it may be particularly advantageous if the control cores and the magnetic field sensitive component fill the magnetic circuit's air gap completely. In some embodiments, it may also be advantageous for the control cores to have the same dimensions, since this may help form a symmetrical setup, although control cores with different dimensions are also possible. Having control cores with common dimensions can also help ensure that the magnetic field sensitive component is located in the center of the air gap that arises on the application of a control current to the control windings of the control cores. Here again, in such an embodiment, when both control windings are switched off, the magnetic field sensitive component will be located in the smallest possible air gap between the two control cores. Such an arrangement may facilitate a particularly large measuring range switching which can measure both small currents and also especially large currents.

In some embodiments, it may be advantageous if the control cores comprise ferrite cores, although other materials are possible. Still, in some of such embodiments it may be beneficial for the ferrite cores to be formed as rectangular frames with a control winding for saturation of the ferrite core on at least one side of the frame. In one particularly efficient embodiment, control windings are disposed on two opposing sides of the frame. By constructing the control core in this shape it is possible to achieve efficient saturation of the control core, which can result in an efficient measuring range switching.

In some illustrative embodiments, the two frames of the relevant control cores are aligned such that the planes within the respective frames are parallel to each other. In one such embodiment, the two frames are aligned such that the planes within the respective frames stand at right angles to each other. In this embodiment, the two planes stand at right angles to each other and the area in contact with the magnetic field sensitive component is minimized to the greatest possible extent. In other words, the area of the air gap in which the magnetic field sensitive component is located is minimized. As a result, the measuring sensitivity is further improved in a mode for measuring small currents, where the control cores are unsaturated.

In some illustrative embodiments, an analyzing device is provided that has control means for separate excitation of the control windings. Here, it is possible for a measuring range switching to take place within a broad range by selecting the relevant excitation—either excitation of both windings, one winding, or no windings. The analyzing device may be integrated with the magnetic field sensitive component in some embodiments, although it is to be appreciated that the present invention is not limited in this respect.

In some illustrative embodiments, the device is disposed in the vicinity of an earth conductor or a positive conductor of a vehicle battery, such as that of a motor vehicle. The device may also be disposed in the vicinity of an electrical load or a group of electrical loads of a vehicle, such as in a motor vehicle. Such an arrangement may be used as a leak current monitor and a charging or discharging monitor. Such an arrangement may also make it possible to monitor the current consumption of individual loads or individual load groups in a vehicle.

Embodiments of the present invention also include methods for measuring a current flowing in an electrical conductor with any of the embodiments of devices described herein. In this regard, methods may include measuring the current passing through the conductor of the magnetic field in a magnetic circuit without excitation of the control cores. Methods may also include a further measurement of the magnetic field in the magnetic circuit with saturated control cores. According to other embodiments, measurement may be performed with saturation of only a single control core. In a further embodiment, a measurement may initially be performed with saturation of a first control core and then with saturation of the second control core. Other methods are also included within the present invention, as the invention is not limited to those described above.

Embodiments of the invention may include a double or triple measurement range switching with the result that it is possible to measure currents reliably in a broad range.

Embodiments of the invention also relate to a use of the device in a motor vehicle for monitoring currents in the vehicle's on-board electrical system. Embodiments may also relate to a use of the method described in the vehicle for monitoring of currents in the vehicle's on-board electrical system. The device described or the method described may, however, also be used as a current sensor in other areas of application, as the present invention is not limited to uses in vehicles.

Turn now to the Figures, and initially FIG. 1, which shows a schematic diagram of one embodiment of a device for measuring a current flowing in an electrical conductor. The device serves to measure a current flowing through an electrical conductor 1. The device comprises a substantially square magnetic circuit 2, which has an air gap 20. Two control cores 3a and 3b are disposed in the air gap 20. The control cores 3a and 3b connect directly to magnetic circuit 2 on their respective sides that face towards magnetic circuit 2. In the embodiment shown, the control cores 3a, 3b are ferrite cores and have rectangular frames, although other configurations are possible. Control windings 4a and 4b are attached respectively on the two long sides of the rectangular ferrite core frames 3a, 3b. A gap 50, is formed between the two control cores 3a, 3b, in which a magnetic field sensitive component 5 is disposed. In the embodiment shown, magnetic field sensitive component 5 is a Hall sensor. The two control cores 3a, 3b and magnetic field sensitive component 5 completely fill air gap 20 of magnetic circuit 2. However, in other embodiments, the air gap 20 of magnetic circuit 2 is not completely filled, but rather an air gap is provided, for example, between the control cores and the magnetic field sensitive component.

The magnetic field coupled into the magnetic circuit 2 is measured in the magnetic field sensitive component 5, which serves to measure the magnetic field surrounding electrical conductor 1, and thus the current flowing through the electrical conductor.

According to some embodiments, if the currents flowing through electrical conductor 1 are small, no current is applied to control windings 4a, 4b, such that the sensitivity of the device will be high. In this mode of operation, the air gap of the effective magnetic circuit is effected by the size of the air gap between the two control cores 3a, 3b, which corresponds to the width of component 5 in the illustrated embodiment. The magnetic field bound in magnetic circuit 2 is thus carried to the magnetic field sensitive component.

When large currents are to be measured, a control current is applied to the control windings 4a, 4b so that the control cores 3a, 3b are saturated. In such a mode, the air gap of magnetic circuit 2 effectively corresponds to air gap 20, as the saturated control cores do not contribute any more to the magnetic circuit. Magnetic field sensitive component 5 is then situated in the present embodiment in the center of air gap 20 of magnetic circuit 2. At this location, the magnetic field of the magnetic circuit 2 is at its weakest. Thus, it is possible in this mode to measure much larger currents through the electrical conductor 1 without exceeding the dynamic response of magnetic field sensitive component.

Figure 2:
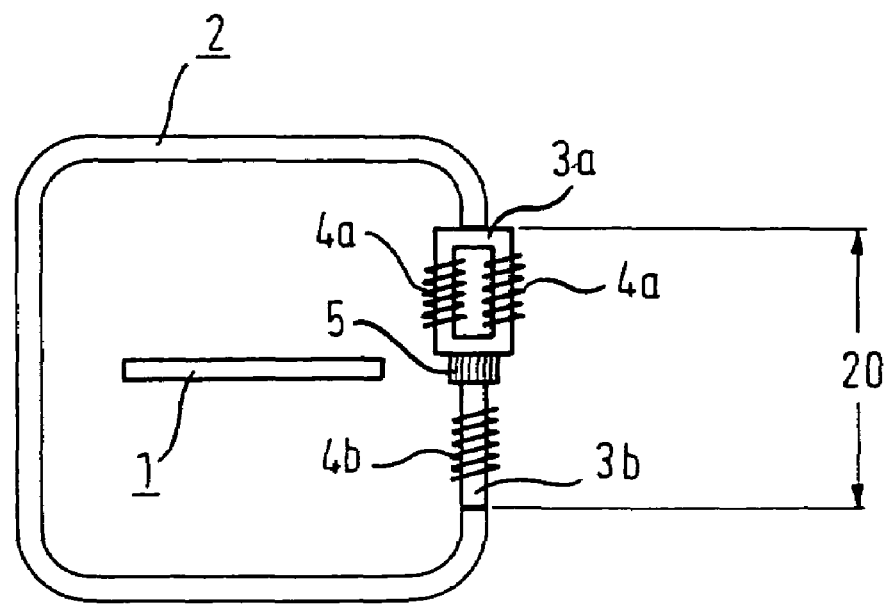
FIG. 2 a schematic diagram of a current sensor in a second embodiment.
Figure 3:
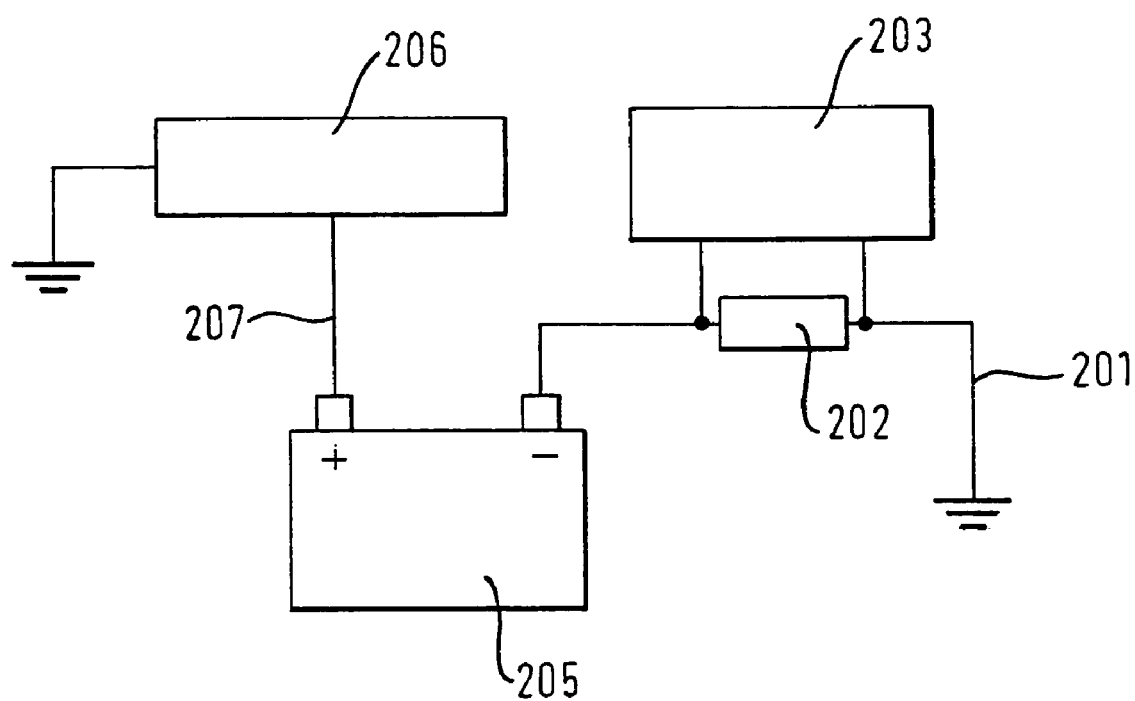
FIG. 3 a schematic diagram of a sensor for measuring battery current according to the prior art.
Figure 4:
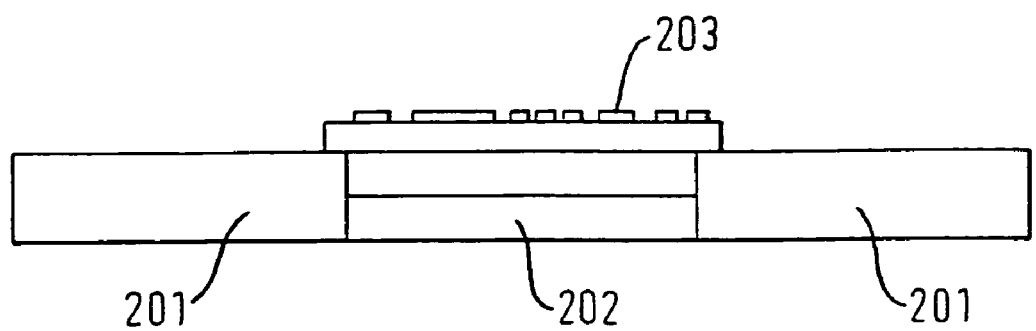
FIG. 4 a sectional diagram of the measuring shunt and the analyzing unit from FIG. 3 according to the prior art.

FIG. 2 shows another illustrative embodiment of the invention. The embodiment of FIG. 2 differs from that shown in FIG. 1 in that the arrangement between the second control core 3b with respect to the first control core 3a is different than that of the embodiment illustrated in FIG. 1. As shown, the plane lying within the frame of control core 3b is turned by 90 degrees vis-a-vis the plane lying within control core 3a. As a result it is possible to minimize the area of the air gap and thus further improve the sensitivity to low currents of the device.

In the embodiment of FIG. 2, the area of the air gap corresponds to a square area with a side length corresponding to the width of ferrite core frame 3a and 3b respectively. Here, it is possible to achieve a further increase in the sensitivity of the device at low currents.

According to some illustrative embodiments, a magnetic field sensitive component 5 is connected to an analyzing unit (not shown) which has control means (not shown) for separate excitation of control windings 4a, 4b. By separate excitation of control windings 4a, 4b it is possible to achieve a measuring process for measuring the currents in which, in a first measuring range, no excitation at all is applied to control windings 4a, 4b, in a second measuring range, one of control windings 4a or 4b is charged with an excitation current with the result that respective control core 3a, 3b is saturated, and then in a third measuring range for measuring high currents both control cores 3a, 3b are saturated by applying corresponding control currents to both control windings 4a, 4b. Magnetic field sensitive component 5 is then situated in the center of the virtual air gap that arises.

In another illustrative embodiments that are not shown, it is also conceivable that more than two control cores be disposed in the air gap and that, by combining the respective saturation currents or by combining the respective saturations of the control cores, different air gap lengths can be generated in respect of magnetic field sensitive component 5. As a result, it may be possible to realize a further adaptation of the measuring range switching to the measuring ranges required in each case.

The device thus constructed is especially suitable for monitoring currents in motor vehicles due to the large measuring range switching.

Having thus described several aspects of at least one embodiment of this invention, it is to be appreciated that various alterations, modifications, and improvements will readily occur to those skilled in the art. By way of example, aspects of the present invention may be used in combination with any of those described in copending application Ser. No. 11/441280, filed May 25, 2006, which is hereby incorporated by reference in its entirety. Such alterations, modifications, and improvements are intended to be part of this disclosure, and are intended to be within the spirit and scope of the invention. Accordingly, the descriptions and drawings herein are by way of example only.

What is claimed:

1. A device for measuring a current flowing in an electrical conductor, said device comprising:

a magnetic circuit having an air gap;

a magnetic field sensitive component disposed in said air gap of said magnetic circuit, said magnetic field sensitive component being suitable for measuring the magnetic field generated by current flowing in the electrical conductor;

one or more control cores incorporated into said magnetic circuit to control an effective length of said air gap, said control cores being disposed in said air gap of said magnetic circuit;

wherein said one or more control cores each has a control winding to saturate said respective control core to control the effective length of said air gap; and said magnetic field sensitive component being disposed between said control cores.

2. The device according to claim 1, wherein said one or more control cores exhibit a first saturation magnetization and said magnetic circuit exhibits a second saturation magnetization, wherein said first saturation magnetization is different than said second saturation magnetization.

3. The device according to claim 1, wherein said one or more control cores exhibit a first saturation magnetization and said magnetic circuit exhibits a second saturation magnetization, wherein said first saturation magnetization is the same as said second saturation magnetization.

4. The device according to claim 1, wherein said magnetic circuit substantially surrounds said electrical conductor.

5. The device according to claim 1, wherein said one or more magnetic circuit comprises a substantially square cross-section.

6. The device according to claim 1, wherein said one or more control cores substantially fill said air gap of said magnetic circuit.

7. The device according to claim 6, wherein said one or more control cores and said magnetic field sensitive component completely fill said air gap.

8. The device according to claim 6, wherein said one or more control cores comprise two control cores have substantially the same dimensions.

9. The device according to claim 6, wherein said one or more control cores are ferrite cores.

10. The device according to claim 9, wherein said ferrite cores comprise rectangular frames which carry a control winding on at least one side of said frame, said control winding being configured to saturate the corresponding ferrite core.

11. The device according to claim 10, wherein said control windings are disposed on two opposing sides of said frame.

12. The device according to claim 10, wherein said frames are aligned such that planes lying within the respective frames are parallel to each other.

13. The device according to claim 10, wherein said frames are aligned such that planes lying within the respective frames are situated at right angles to each other.

14. The device according to claim 10, further comprising: an analyzing device including a control for separate excitation of said control windings.

15. The device according to claim 14, wherein said analyzing device is integrated with said magnetic field sensitive component.

16. The device according to claim 1, wherein said device is coupled to a positive conductor of a vehicle battery.

17. The device according to claim 1, wherein said device is positioned within a vehicle to measure an electrical consumer load of a vehicle.

18. The device of claim 1 positioned in a motor vehicle to monitor currents in an on-board electrical system of the vehicle.

19. A method for measuring a current flowing in an electrical conductor, the method comprising:
providing a device for measuring current flowing in an electrical conductor, the device comprising:
a magnetic circuit having an air gap;
a magnetic field sensitive component disposed in said air gap of said magnetic circuit, said magnetic field sensitive component being suitable for measuring the magnetic field generated by current flowing in the electrical conductor;
one or more control cores incorporated into said magnetic circuit to control said air gap, said control cores being disposed in said air gap of said magnetic circuit;
wherein said one or more control cores each have a control winding to saturate said respective control core to control an effective length of said air gap;
said magnetic field sensitive component being disposed between said control cores;
measuring the magnetic field in said magnetic circuit without excitation of said control cores; and
measuring the magnetic field in said magnetic circuit with saturated control cores.

20. The method according to claim 19, further comprising:
measuring the magnet field in said magnetic circuit with only a single control circuit saturated.

21. The method according to claim 20, wherein measuring the magnetic field is carried out initially with a saturated first control core and then with a saturated second control core.

22. The method according to claim 19, further comprising:
using the device in a motor vehicle for monitoring currents in an on-board electrical system of the vehicle.

23. A device for measuring a current over a first range and a second range, said device comprising:
a magnetic circuit positioned adjacent to a conductor and defining an air gap;
a magnetic field sensitive component positioned in said air gap to measure a magnetic field generated by current flowing in an electrical conductor;
a control core incorporated into said magnetic circuit adjacent to said magnetic field sensitive component; and
a control winding that, when activated, saturates said control core;
wherein said device is configured to measure currents flowing in the electrical conductor in a first range of current values when said control winding is unactivated, and further wherein said device is configured to measure currents flowing in the electrical conductor in a second range of current values, at least some of which are greater than the first range of current values, when said control winding is activated.

24. The device according to claim 23, further comprising:
a second control core incorporated into the magnetic circuit adjacent to said magnetic field sensitive component; and
a second control winding that when activated saturates said second control core.

25. A method of measuring current over a first range and a second range, the method comprising:
positioning a magnetic circuit adjacent to a conductor that carries a current to be measured;
positioning a magnetic field sensitive component in an air gap of said magnetic circuit;
measuring a magnetic field generated by current in the first range flowing in the electrical conductor;
incorporating a control core having a control winding into said magnetic circuit adjacent to said magnetic field sensitive component; and
activating said winding to saturate said control core to allow the device to measure current in the second range flowing in the electrical conductor.

* * * * *